(12) United States Patent
Saitoh et al.

(10) Patent No.: US 6,403,976 B1
(45) Date of Patent: Jun. 11, 2002

(54) SEMICONDUCTOR CRYSTAL, FABRICATION METHOD THEREOF, AND SEMICONDUCTOR DEVICE

(75) Inventors: Tohru Saitoh; Yoshihiko Kanzawa, both of Osaka; Koji Katayama, Nara; Katsuya Nozawa, Osaka; Gaku Sugahara, Nara; Minoru Kubo, Mie, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/482,077

(22) Filed: Jan. 13, 2000

(30) Foreign Application Priority Data

Jan. 14, 1999 (JP) .............................. 11-007642

(51) Int. Cl.[7] .............................................. H01L 29/06
(52) U.S. Cl. ........................... 257/19; 257/22; 257/192; 257/77; 257/616
(58) Field of Search .................. 257/19, 20, 22, 257/191, 192, 194, 77, 616

(56) References Cited

FOREIGN PATENT DOCUMENTS

JP          10-116919     *  5/1998

OTHER PUBLICATIONS

K. Brunner et al., "Fabrication and band alignment of pseudomorphic $Si_{1-y}C_y$, $Si_{1-x-y}Ge_xC_y$ and coupled $Si_{1-y}C_{y/Si1-x-y}Ge_xC_y$ quantum well structures on Si substrates", Journal of Crystal Growth, 175/176, pp. 451–458, 1997.

K. Eberl et al., "Strain symmetrization effects in pseudomorphic $Si_{1-y}C_y/Si_{1-x}Ge_x$ superlattices", Appl. Phys. Lett. 64(6), pp. 739–741, Feb. 7, 1994.

P. Boucaud et al., "Growth of $Si_{1-x-y}Ge_xC_y$ multi–quantum wells: structural and optical properties", Thin Solid Films 278, pp. 114–117, 1996.

Powell et al. (Apr. 1, 1994) Jpn. J. Applied Phys. vol. 33 (No. 4B) *Silicon–Germanium–Carbon Alloys Extending Si Based Heterostructure Engineering*, pp. 2388–2391.

Perez–Rodriguez et al. (Dec. 1, 1996) Nucl. Instr. And Meth. In Phys. Res. B *Ion Beam Synthesis and Recrystallization of Amorphous SiGe/SiC structures*, pp. 151–155.

Zerlauth et al. (May 1, 1997) J. of Crys. Growth, *MBE Growth and structural characterization of $Si_{1-y}C_y/Si_{1-x}Ge_x$ superlattices*.

* cited by examiner

Primary Examiner—Mark V. Prenty
(74) Attorney, Agent, or Firm—Eric J. Robinson; Nixon Peabody LLP

(57) ABSTRACT

A $Si_{1-x}Ge_x/Si_{1-y}C_y$ short-period superlattice which functions as a single SiGeC layer is formed by alternately growing $Si_{1-x}Ge_x$ layers (0<x<1) and $Si_{1-y}C_y$ layers (0<y<1) each having a thickness corresponding to several atomic layers which is small enough to prevent discrete quantization levels from being generated. This provides a SiGeC mixed crystal which is free from Ge—C bonds and has good crystalline quality and thermal stability. The $Si_{1-x}Ge_x/Si_{1-y}C_y$ short-period superlattice is fabricated by a method in which $Si_{1-x}Ge_x$ layers and $Si_{1-y}C_y$ layers are epitaxially grown alternately, or a method in which a $Si/Si_{1-x}Ge_x$ short-period superlattice is first formed and then C ions are implanted into the superlattice followed by annealing for allowing implanted C ions to migrate to Si layers.

4 Claims, 8 Drawing Sheets

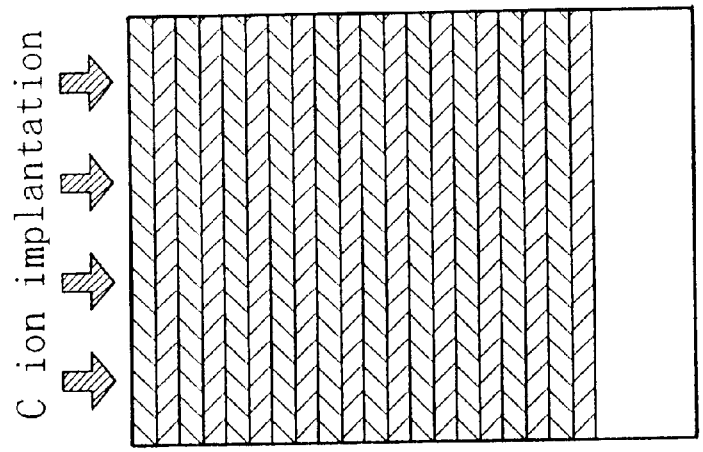
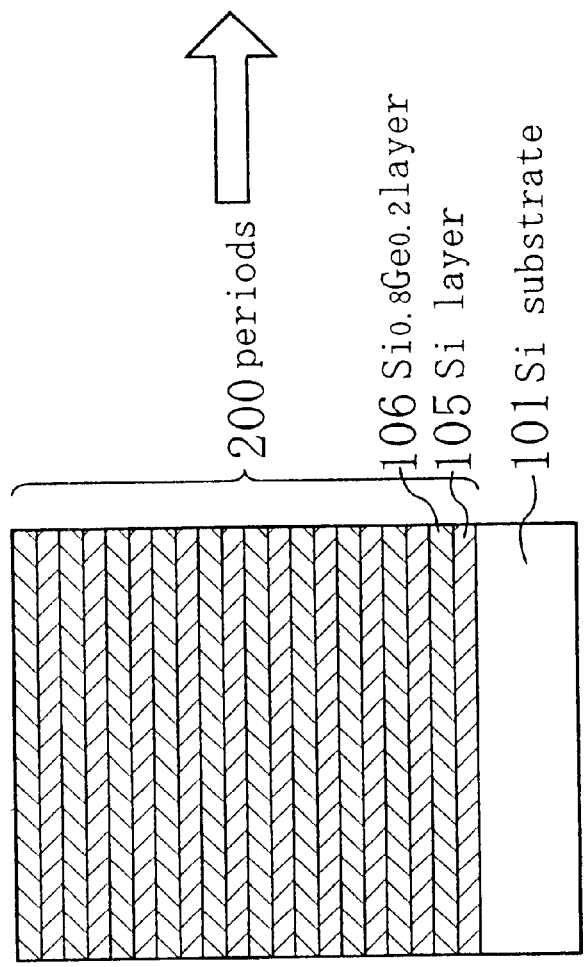

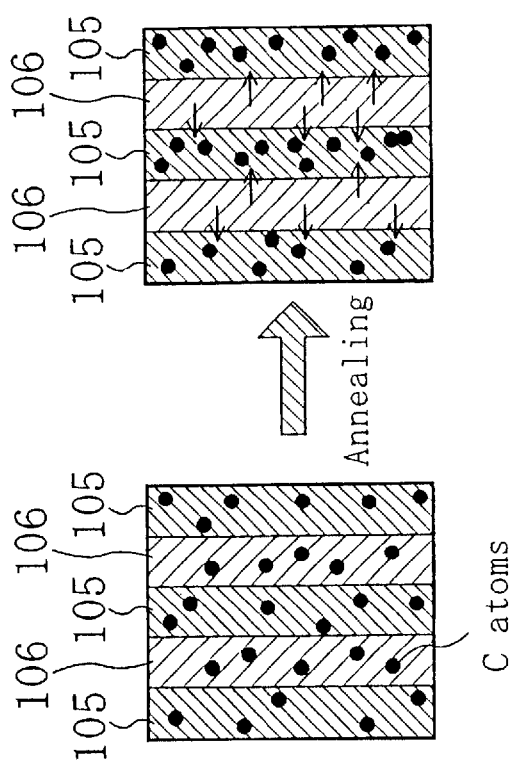
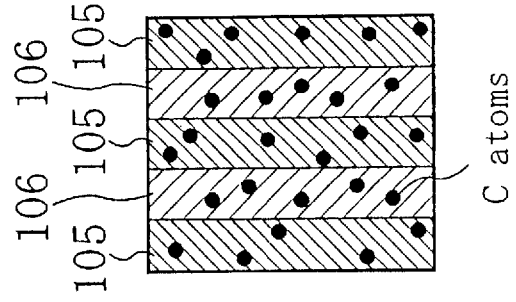
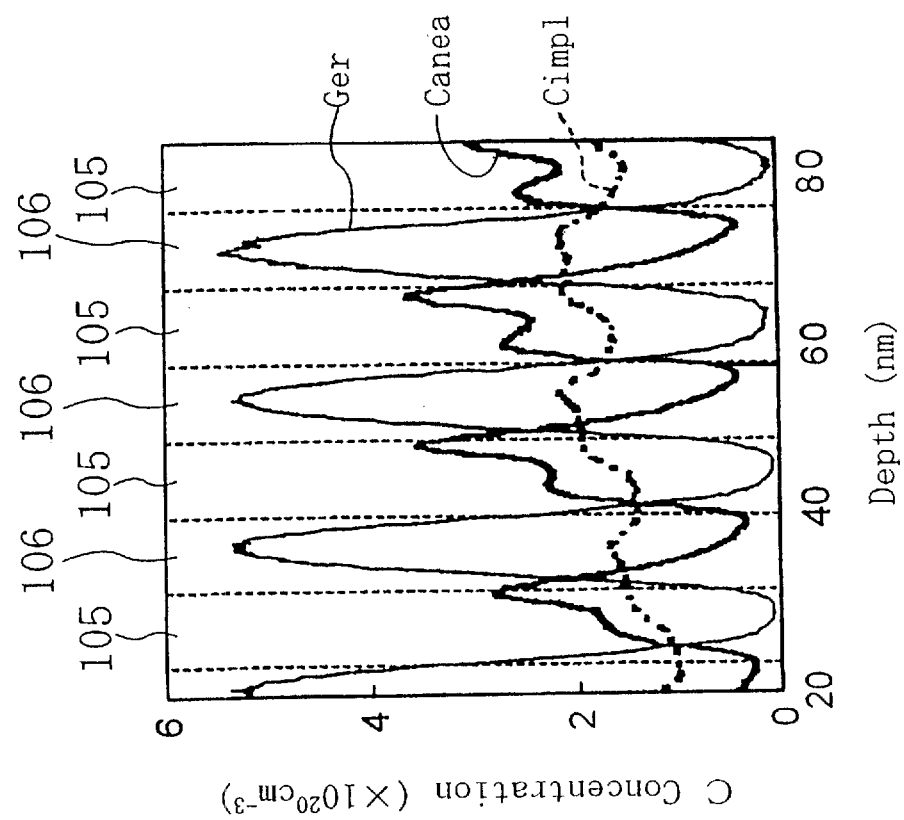

SEMICONDUCTOR CRYSTAL, FABRICATION METHOD THEREOF, AND SEMICONDUCTOR DEVICE

BACKGROUND OF THE INVENTION

The present invention relates to a group IV element mixed crystal semiconductor, a fabrication method thereof, and a semiconductor device using such a mixed crystal semiconductor.

In recent years, attempts have been made to fabricate a semiconductor device utilizing heterojunction on a Si substrate for realizing a semiconductor device capable of operating at a higher speed than a conventional homojunction Si device. As materials for formation of heterojunction with Si, SiGe and SiGeC are expected promising, which are mixed crystal semiconductors including Ge and C, elements of the same group IV as Si.

In particular, a SiGeC ternary mixed crystal semiconductor has attracted considerable attention because the band gap and lattice constant thereof can be controlled independently by changing the mole fraction of the three elements, providing high degree of freedom in device design and allowing for lattice match with Si. For example, as disclosed in Japanese Laid-Open Patent Publication No. 10-116919, it is considered possible to realize a field effect transistor capable of operating at a higher speed than a conventional Si device by utilizing conduction band discontinuity formed at a hetero-interface between a Si layer and a SiGeC layer to use two-dimensional electron gas generated at the interface as a carrier.

Presently, a SiGeC mixed crystal is prepared by a method in which C source gas is introduced during epitaxial growth of a SiGe layer, or a method in which C ions are implanted into a SiGe layer.

However, as described in Applied Physics Letters, Vol. 65 (1994) p. 2559, for example, the incorporation of carbon into a SiGe layer has its limitation. It is known that the SiGe layer markedly degrades in crystalline quality and becomes amorphous when about 4% or more of C atoms is introduced into the SiGe layer. Moreover, according to experiments carried out by the present inventors, a SiGeC layer degrades in crystalline quality when it is annealed at certain temperatures. In particular, it has been observed that the degradation in crystalline quality tends to become more significant as the C concentration increases.

FIG. 8 is a view of data obtained from the experiments carried out by the present inventors, showing a change in X-ray diffraction spectra of samples of a $SiGe_{0.31}C_{0.0012}$ crystal layer annealed at various temperatures. As is observed from this figure, the positions of the diffraction peaks of the samples annealed at temperatures of 800° C. or lower are hardly different from that of the as-grown sample. However, the position of the diffraction peak of the sample annealed at 900° C. exhibits a little shift from that of the as-grown sample, and as the annealing temperature is increased to 950° C. or higher, the position of the diffraction peak of the annealed sample starts shifting widely from that of the as-grown sample. Moreover, for the samples annealed at temperatures of 1000° C. or higher, while the half-width at the peak increases, fringes observed in the diffraction spectrum of the as-grown sample almost disappear. Thus, according to the illustrated experiment data, it is found that the $SiGe_{0.31}C_{0.0012}$ crystal layer degrades in crystalline quality when it is annealed at about 950° C. or higher.

The present inventors have further carried out experiments to investigate the cause of the degradation in the crystalline quality of the SiGeC crystal layer, and found that the degradation of the SiGeC crystal layer by annealing is mainly because Ge—C bonds in the mixed crystal is markedly unstable compared with Si—C bonds.

FIGS. 7(a) and 7(b) are views showing changes in X-ray diffraction spectra of samples of a $Ge_{0.98}C_{0.02}$ crystal layer grown on a Ge substrate and a $Si_{0.98}C_{0.02}$ crystal layer grown on a Si substrate, respectively, annealed at various temperatures. The $Ge_{0.98}C_{0.02}$ crystal layer was grown by implanting C ions into a Ge substrate followed by annealing, and the $Si_{0.98}C_{0.02}$ crystal layer was epitaxially grown on a Si substrate using Si and C source gases.

As shown in FIG. 7(a) where a $Ge_{0.98}C_{0.02}$ crystal layer was grown on a Ge substrate, the diffraction peaks of the samples annealed at 475 to 550° C. are observed at substantially the same positions, whereas no diffraction peaks are observed for the samples annealed at 450° C. or lower. When the annealing temperature is 600° C. or higher, the diffraction peak position of the $Ge_{0.98}C_{0.02}$ crystal layer shifts. In particular, the peak disappears for the sample annealed at 700° C. or higher. This indicates that the GeC crystal is subjected to some change when it is annealed at a temperature of 600° C. or higher. More specifically, it indicates that Ge—C bonds are segregated.

As shown in FIG. 7(b) where a $Si_{0.98}C_{0.02}$ crystal layer was grown on a Si substrate, the diffraction peak is clearly observed for the $Si_{0.98}C_{0.02}$ crystal layer annealed at a temperature up to 1000° C.

In view of the above results, it is found that the instability of Ge—C bonds is a cause of the degradation in the crystalline quality of the SiGeC crystal, indicating that suppressing formation of Ge—C bonds is a decisive factor for improving the crystalline quality.

SUMMARY OF THE INVENTION

An object of the present invention is providing a SiGeC mixed crystal with good crystalline quality and thermal stability, a fabrication method thereof, and a semiconductor device using such a SiGeC mixed crystal. This can be achieved by eliminating the cause of instability of a SiGeC layer, i.e., by forming a short-period superlattice layer which is free from Ge—C bonds but nevertheless can be considered as a SiGeC crystal layer.

The semiconductor crystal of the present invention comprises a $Si_{1-x}Ge_x/Si_{1-y}C_y$ superlattice structure (0<x,y<1) including two or more periods of alternately grown $Si_{1-x}Ge_x$ layers containing Si and Ge as major components and $Si_{1-y}C_y$ layers containing Si and C as major components, wherein the $Si_{1-x}Ge_x/Si_{1-y}C_y$ superlattice structure functions as a single SiGeC layer.

The above $Si_{1-x}Ge_x/Si_{1-y}C_y$ superlattice structure can function as a single SiGeC layer with Ge—C bonds hardly contained therein. As a result, a semiconductor crystal which can maintain good crystalline quality stably even when subjected to annealing and still has the same function as a SiGeC layer is obtained.

The thickness of each of the $Si_{1-x}Ge_x$ layers and the $Si_{1-y}C_y$ layers in the $Si_{1-x}Ge_x/Si_{1-y}C_y$ superlattice is smaller than the thickness which allows discrete quantization levels to be generated. This ensures to obtain the $Si_{1-x}Ge_x/Si_{1-y}C_y$ short-period superlattice which functions as a single SiGeC layer.

The semiconductor device of the present invention comprises: a substrate; a first semiconductor layer containing at least Si, formed on the substrate; and a second semiconductor layer formed in contact with the first semiconductor layer for functioning as a SiGeC layer, wherein the second semiconductor layer has a structure including two or more periods of alternately grown $Si_{1-x}Ge_x$ layers (0<x<1) containing Si and Ge as major components and $Si_{1-y}C_y$ layers (0<y<1) containing Si and C as major components.

By the above construction, heterojunction such as Si/SiGeC can be formed between the first and second semiconductor layers. Utilizing this heterojunction, an advanced semiconductor device, e.g., a field effect transistor which functions as a high electron mobility transistor (HEMT), can be provided.

The thickness of each of the $Si_{1-x}Ge_x$ layers and the $Si_{1-y}C_y$ layers is preferably smaller than the thickness which allows discrete quantization levels to be generated.

The first fabrication method of a semiconductor crystal of the present invention comprises repeating epitaxial growth of a $Si_{1-x}Ge_x$ layer (0<x<1) containing Si and Ge as major components and epitaxial growth of a $Si_{1-y}C_y$ layer (0<y<1) containing Si and C as major components alternately by two or more times, to form a $Si_{1-x}Ge_x/Si_{1-y}C_y$ short-period superlattice which functions as a single SiGeC layer.

By the above method, the semiconductor crystal described above can be easily fabricated.

The second fabrication method of a semiconductor crystal of the present invention comprises the steps of: (a) repeating epitaxial growth of a $Si_{1-x}Ge_x$ layer (0<x<1) containing Si and Ge as major components and epitaxial growth of a Si layer containing Si as a major component alternately by two or more times, to form a $Si_{1-x}Ge_x/Si$ multilayer structure; (b) implanting C ions into the $Si_{1-x}Ge_x/Si$ multilayer structure; and (c) annealing the C-implanted $Si_{1-x}Ge_x/Si$ multilayer structure, to form a $Si_{1-x}Ge_x/Si_{1-y}C_y$ multilayer structure (0<y<1).

According to the above method, the phenomenon of migration of C atoms to the Si layers caused by segregation of Ge—C bonds during the annealing is utilized. Also, the substrate surface can be kept clean since no source gas for C doping is required during epitaxial growth of the layers. Thus, a $Si_{1-x}Ge_x/Si_{1-y}C_y$ multilayer structure which can be used for a variety of applications is obtained.

In the step (a), the $Si_{1-x}Ge_x$ layers and the Si layers may be formed so that the $Si_{1-x}Ge_x$ layers and $Si_{1-y}C_y$ layers of the resultant $Si_{1-x}Ge_x/Si_{1-y}C_y$ multilayer structure have a thickness large enough to allow discrete quantization levels to be generated. In this case, a $Si_{1-x}Ge_x/Si_{1-y}C_y$ multilayer structure which functions as a multiquantum barrier (MQB) or the like useful for construction of a quantum device is obtained.

Alternatively, in the step (a), the $Si_{1-x}Ge_x$ layers and the Si layers may be formed so that the $Si_{1-x}Ge_x$ layers and $Si_{1-y}C_y$ layers of the resultant $Si_{1-x}Ge_x/Si_{1-y}C_y$ multilayer structure have a thickness smaller than the thickness which allows discrete quantization levels to be generated. In this case, a $Si_{1-x}Ge_x/Si_{1-y}C_y$ multilayer structure which functions as a single SiGeC layer useful for construction of a heterojunction semiconductor device is obtained.

In the above fabrication method, the annealing temperature in the step (c) is preferably higher than 700° C.

BRIEF DESCRIPTION OF THE DRAWINGS

FIGS. 3(a) and 3(b) are cross-sectional views illustrating fabrication steps of a $Si_{1-x}Ge_x/Si_{1-y}C_y$ multilayer structure of EMBODIMENT 2.

FIGS. 4(a), 4(b), and 4(c) are views showing the concentration distributions of Ge atoms and C atoms in a superlattice before and after annealing, the distribution of C atoms in the superlattice immediately after C ion implantation, and the distribution of C atoms in the superlattice after annealing.

DESCRIPTION OF THE PREFERRED EMBODIMENTS

Hereinafter, preferred embodiments of the present invention will be described with reference to the accompanying drawings.

EMBODIMENT 1

Figure 1A:
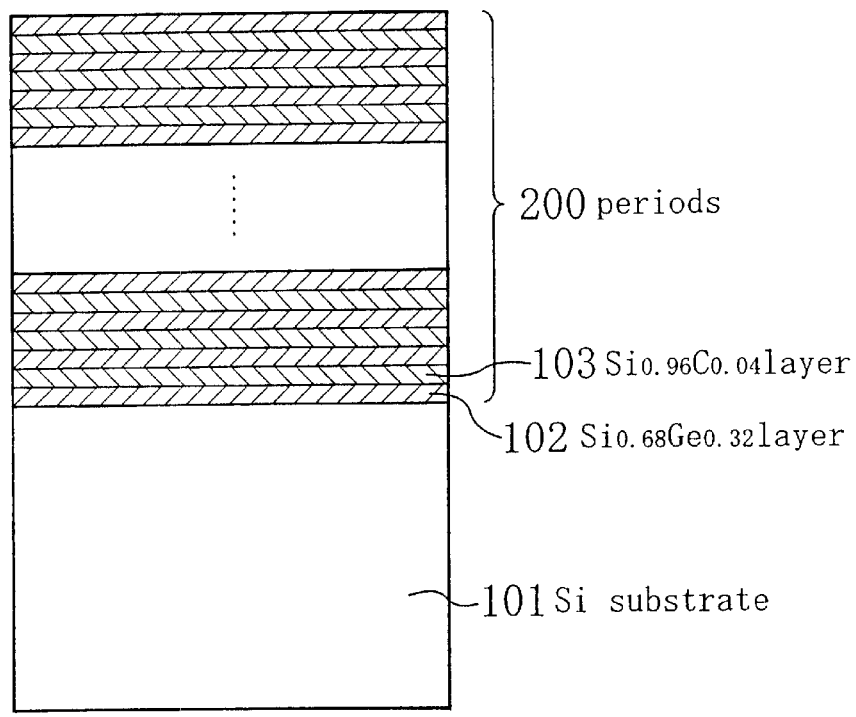
FIGS. 1(a) and 1(b) are views schematically illustrating the macroscopic multilayer structure of a $Si_{1-x}Ge_x/Si_{1-y}C_y$ short-period superlattice of EMBODIMENT 1 and the microscopic multilayer structure of the short-period superlattice, respectively.
Figure 1B:
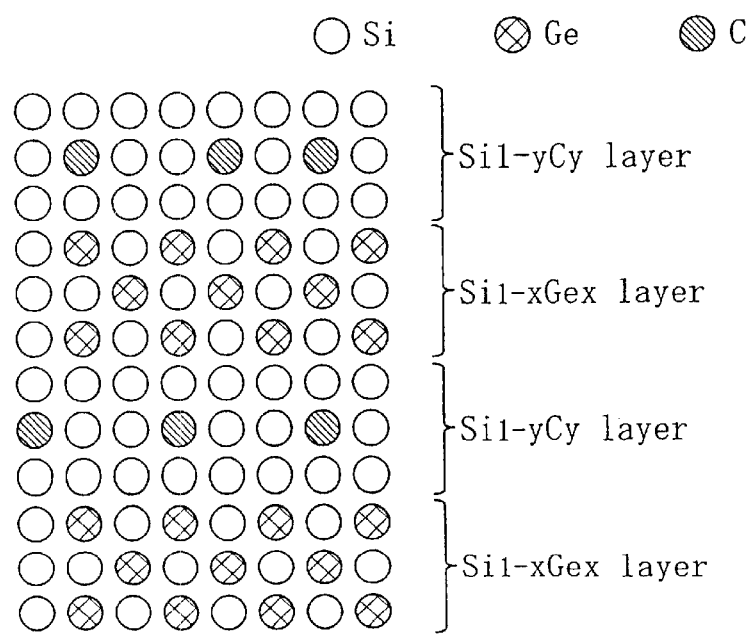

FIGS. 1(a) and 1(b) are views schematically illustrating a macroscopic multilayer structure of a SiGeC mixed crystal (a $Si_{1-x}Ge_x/Si_{1-y}C_y$ short-period superlattice (0<x,y<1)) of EMBODIMENT 1, and a microscopic multilayer structure (atomic configuration) of the short-period superlattice, respectively.

As shown in FIG. 1(a), the SiGeC mixed crystal of this embodiment includes 200 periods of $Si_{0.68}Ge_{0.32}$ layers 102 and $Si_{0.98}C_{0.04}$ layers 103 alternately grown on a Si substrate 101. As shown in FIG. 1(b), each of the layers 102 and 103 is essentially composed of three atomic layers.

The SiGeC mixed crystal is fabricated in the following manner. The $Si_{0.68}Ge_{0.32}$ layer 102 and the $Si_{0.98}C_{0.04}$ layer 103, each of the three atomic layer structure, are epitaxially grown on the Si (001) substrate 101 by ultra high vacuum chemical vapor deposition (UHV-CVD). This growth is repeated for 200 times, so that the entire thickness of the SiGeC mixed crystal is about 160 nm. As Si, Ge, and C source gases, $Si_2H_6$, $GeH_4$, and $SiH_3CH_3$, respectively, are used. The growth temperature is about 550° C.

Although the actual atomic configuration of the resultant short-period superlattice constitutes a diamond structure, the atomic layers are shown in a tetragonal shape in FIG. 1(b) for easier understanding of the concept of the invention. As illustrated, Ge atoms and C atoms never exist in a common layer, so that Ge—C bonds are hardly formed. Nevertheless, the resultant short-period superlattice functions as one SiGeC mixed crystal, as will be described hereinbelow.

Figure 2:
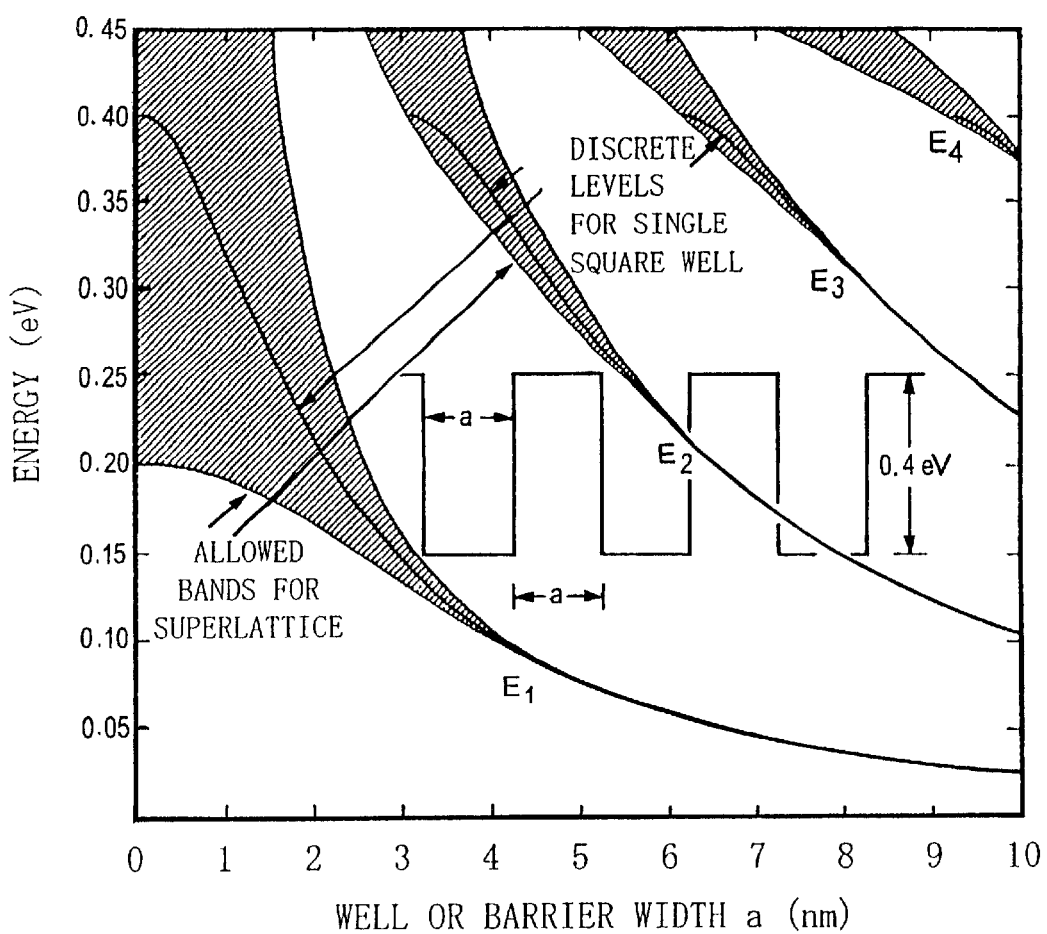
FIG. 2 is a view showing a change in an energy band structure observed when the thickness of well layers/barrier layers of a multilayer structure is changed.

FIG. 2 is a view showing a change in an energy band structure observed when the thickness of well layers/barrier layers of a multilayer structure is changed (shown in FIG. 18 of C. Weisbuch, Semiconductor and Semimetals, Vol. 24, Academic Press, Inc., p. 29, Vol. Ed. Raymond Dingle). The X-axis represents the thickness (nm) of well layers/barrier layers, and the Y-axis represents a potential energy (eV). As is observed from FIG. 2, while discrete quantization levels are formed when the thickness of the well layers/barrier layers is about 10 nm, such discrete quantization levels are lost forming one bulk band when the thickness is reduced to about 1.5 nm or less. In other words, with the quantization effect being lost, carriers recognize the entire short-period superlattice as one layer and act accordingly. Likewise, in the short-period superlattice shown in FIGS. 1(a) and 1(b), when the thickness of each layer is about 1.0 nm or less, discrete quantization levels are lost to allow the entire superlattice to function as a single SiGeC layer.

The average thickness of each layer of the $Si_{1-x}Ge_x/Si_{1-y}C_y$ short-period superlattice (0<x,y<1) of this embodiment is about 0.8 nm. Therefore, the superlattice of this embodiment can function as a SiGeC layer while securing the stability of the crystalline quality obtained from the fact that Ge—C bonds are hardly formed.

Thus, based on the finding that a disadvantage of the conventional SiGeC layer is caused by instability of Ge—C bonds, the fabrication method of this embodiment provides a $Si_{1-x}Ge_x/Si_{1-y}C_y$ short-period superlattice which is free from Ge—C bonds but nevertheless can function as a SiGeC layer.

EMBODIMENT 2

In this embodiment, a fabrication method of a $Si_{1-x}Ge_x/Si_{1-y}C_y$ multilayer structure (0<x,y<1), which can be used for formation of a $Si_{1-x}Ge_x/Si_{1-y}C_y$ short-period superlattice, will be described. In this method, C ions are implanted into a $Si/Si_{1-x}Ge_x$ multilayer film and the resultant multilayer film is annealed. FIGS. 3(a) and 3(b) are cross-sectional views illustrating steps of fabricating the $Si_{1-x}Ge_x/Si_{1-y}C_y$ multilayer structure.

At the step shown in FIG. 3(a), Si layers 105 having a thickness of 10 nm and $Si_{0.8}Ge_{0.2}$ layers 106 having a thickness of 10 nm are epitaxially grown on a Si (001) substrate 101 alternately by UHV-CVD, to obtain a $Si/Si_{0.8}Ge_{0.2}$ superlattice of a total of 10 periods.

Subsequently, at the step shown in FIG. 3(b), C ions are implanted into the superlattice under the conditions of an accelerating energy of about 45 KeV and a dose amount of about $1 \times 10^{15}$ cm$^{-2}$, followed by annealing at 950° C. for 15 seconds.

FIGS. 4(a), 4(b), and 4(c) are views showing the concentration distributions of Ge atoms and C atoms in the superlattice before and after the annealing, the distribution of C atoms in the superlattice after the C ion implantation, and the distribution of C atoms in the superlattice after the annealing.

In FIG. 4(a), the X-axis represents the depth in the superlattice, and the Y-axis represents the concentration. A curve Ger represents the concentration of Ge, a curve $C_{impl}$ represents the concentration of C immediately after the ion implantation and before the annealing, and a curve $C_{annea}$ represents the concentration of C after the annealing. As is indicated by the curve $C_{impl}$, before the annealing, C atoms are distributed substantially uniformly at a concentration of about $1 \times 10^{20}$ cm$^{-3}$ both in the Si layers 105 and the $Si_{0.8}Ge_{0.2}$ layers 106. On the contrary, as is indicated by the curve $C_{annea}$, after the annealing, the C concentration increases in the Si layers 105 while it decreases in the $Si_{0.8}Ge_{0.2}$ layers 106. This is because, as shown in FIGS. 4(b) and 4(c), the C atoms in the $Si_{0.8}Ge_{0.2}$ layers migrate to the adjacent Si layers during the annealing.

Thus, by implanting C ions into the $Si/Si_{0.8}Ge_{0.2}$ superlattice and then annealing the resultant superlattice, a $Si_{1-y}C_y/Si_{0.8}Ge_{0.2}$ superlattice can be obtained without the necessity of C ion doping during the epitaxial growth.

Figure 5:
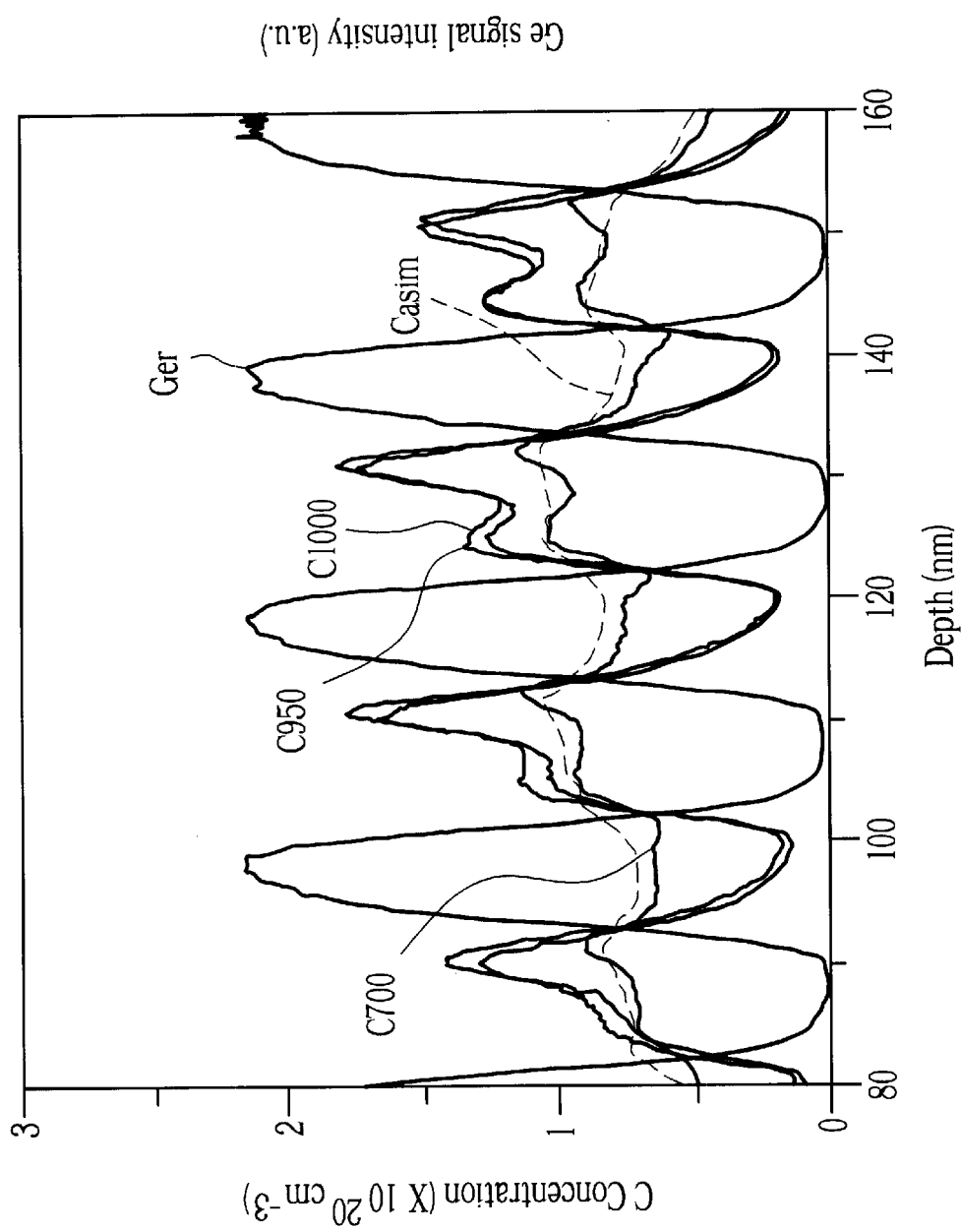
FIG. 5 is a view showing the concentration distributions of C atoms in the superlattice fabricated by the steps shown in FIGS. 3(a) and 3(b) observed when annealed at different temperatures.

FIG. 5 is a view showing a difference between concentration distributions of C atoms obtained when the superlattice formed by the steps shown in FIGS. 3(a) and 3(b) is annealed at different annealing temperatures. In FIG. 5, a curve ger represents the concentration of Ge in the superlattice, a curve $C_{asim}$ represents the concentration of C in the superlattice immediately after the ion implantation and before the annealing, a curve $C_{700}$ represents the concentration of C in the superlattice annealed at 700° C., a curve $C_{950}$ represents the concentration of C in the superlattice annealed at 950° C., and a curve $C_{1000}$ represents the concentration of C in the superlattice annealed at 1000° C. The annealing time was 15 seconds for all cases. As is observed from FIG. 5, while the migration of C atoms is not sufficient for the annealing at 700° C., it is sufficient for the annealing at 950° C. and 1000° C. Furthermore, the concentration distributions obtained after the annealing at the latter two temperatures are almost the same. This indicates that a stable structure has been established at the SiC/SiGe interfaces by the method of this embodiment.

The fabrication method of this embodiment has the following advantage over the method of fabricating a $Si_{1-x}Ge_x/Si_{1-y}C_y$ multilayer structure by alternating $Si_{1-x}Ge_x$ layers and $Si_{1-y}C_y$ layers by epitaxial growth.

In the case of alternating $Si_{1-x}Ge_x$ layers and $Si_{1-y}C_y$ layers, a clean substrate surface may not always be obtained since a C source material may be left floating in a growth chamber after the growth of the $Si_{1-y}C_y$ layers. On the other hand, in the case of implanting C ions, it had conventionally been considered difficult to selectively dope only one of the two types of layers constituting a multilayer structure with carbon. According to the fabrication method of a $Si_{1-x}Ge_x/Si_{1-y}C_y$ multilayer structure of this embodiment, a $Si/Si_{1-x}Ge_x$ multilayer structure is first formed. Then, C ions are implanted into the $Si/Si_{1-x}Ge_x$ multilayer structure, and the resultant structure is annealed to utilize the phenomenon that C atoms migrate to the Si layers during annealing. In this way, the $Si_{1-x}Ge_x/Si_{1-y}C_y$ multilayer structure is obtained.

Thus, based on the finding that a disadvantage of the conventional SiGeC layer is caused by instability of Ge—C bonds, the fabrication method of this embodiment utilizes the migration of C atoms due to the instability of Ge—C bonds to form a $Si_{1-x}Ge_x/Si_{1-y}C_y$ multilayer structure.

When the $Si_{1-x}Ge_x$ layers and the $Si_{1-y}C_y$ layers of the resultant $Si_{1-x}Ge_x/Si_{1-y}C_y$ multilayer structure have a thickness large enough to allow discrete quantization levels to be generated (e.g., the case of this embodiment), a $Si_{1-x}Ge_x/Si_{1-y}C_y$ superlattice which can function as a multiquantum barrier (MQB) or the like is obtained.

On the contrary, when the $Si_{1-x}Ge_x$ layers and the $Si_{1-y}C_y$ layers of the $Si_{1-x}Ge_x/Si_{1-y}C_y$ multilayer structure have a thickness smaller than the thickness which allows discrete quantization levels to be generated, a $Si_{1-x}Ge_x/Si_{1-y}C_y$ short-period superlattice which can function as a single SiGeC layer, as in EMBODIMENT 1 described above, is obtained. The reason is as follows.

It has been confirmed qualitatively that the phenomenon of migration of C atoms described in this embodiment also occurs for Si layers and $Si_{0.8}Ge_{0.2}$ layers both having a thickness of 1 nm or less. The migration of C atom has also been confirmed for any Ge content in the SiGe layers and any conditions of C ion implantation.

Therefore, a $Si_{0.8}Ge_{0.2}/SiC$ short-period superlattice which functions as one SiGeC layer can be obtained as in EMBODIMENT 1 by employing the fabrication method of this embodiment, that is, by first growing Si layers and $Si_{1-x}Ge_x$ layers each having a thickness of 1.0 nm or less and then subjecting to C ion implantation and annealing.

In the fabrication method of EMBODIMENT 1 where the $Si_{1-x}Ge_x$ layers and the $Si_{1-y}C_y$ layers are alternately grown, a clean substrate surface may not always be obtained since a C source material may be left floating in a growth chamber after the growth of the $Si_{1-y}C_y$ layers as described above. On the contrary, in this embodiment, the $Si/Si_{1-x}Ge_x$ superlattice is first formed, and then C ions are implanted into the $Si/Si_{1-x}Ge_x$ superlattice, followed by annealing to utilize the phenomenon of migration of C atoms to the Si layers during the annealing. In this way, a $Si_{1-x}Ge_x/Si_{1-y}C_y$ short-period superlattice which can function as a SiGeC layer can be fabricated easily and swiftly.

EMBODIMENT 3

Figure 6:
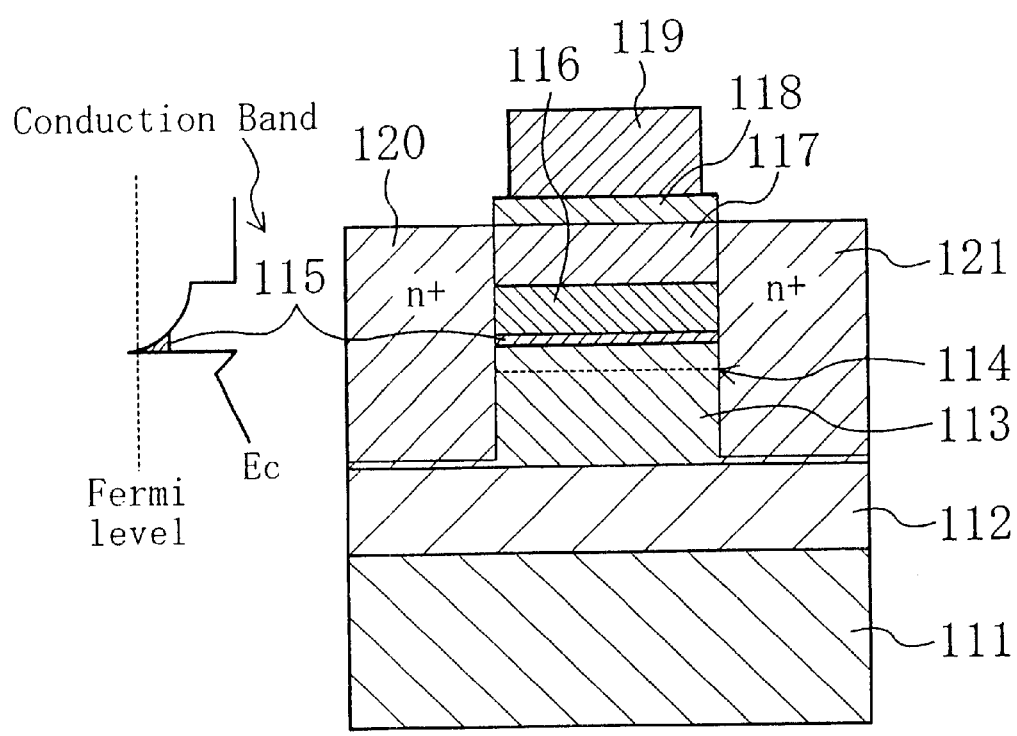
FIG. 6 is a cross-sectional view of a heterojunction field effect transistor (HMOSFET) of EMBODIMENT 3 which is a semiconductor device including a short-period superlattice.
Figure 7A:
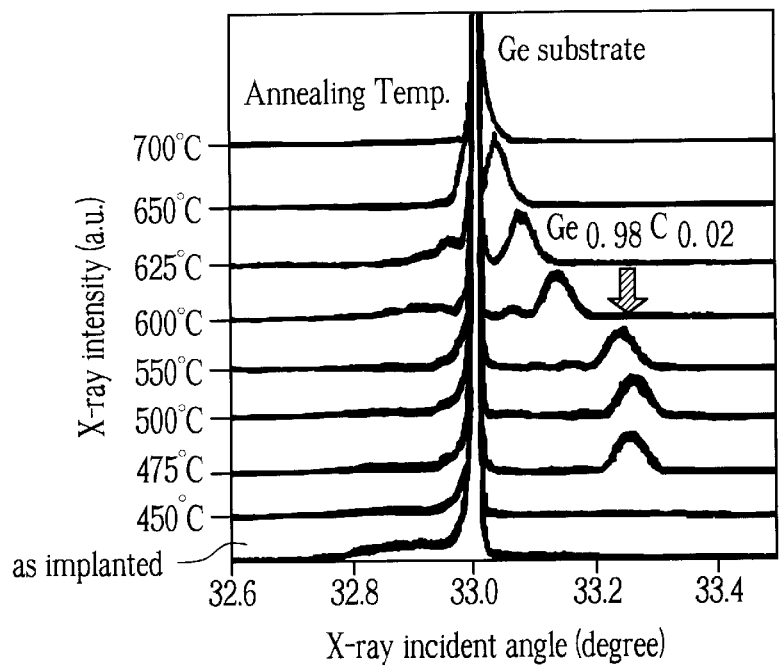
FIGS. 7(a) and 7(b) are views showing changes in X-ray diffraction spectra of samples of a $Ge_{0.98}C_{0.02}$ crystal layer grown on a Ge substrate and a $Si_{0.98}C_{0.02}$ crystal layer grown on a Si substrate, respectively, annealed at various temperatures.
Figure 7B:
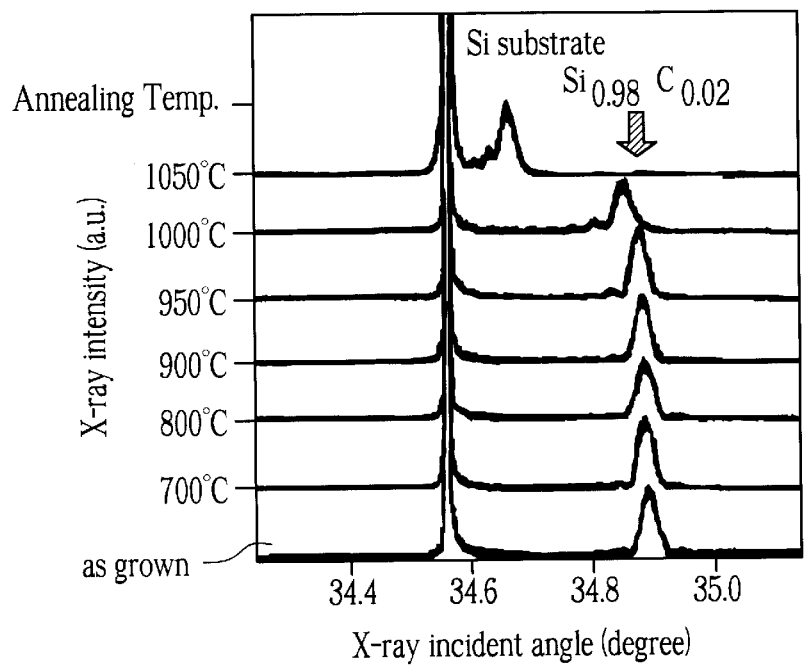
Figure 8:
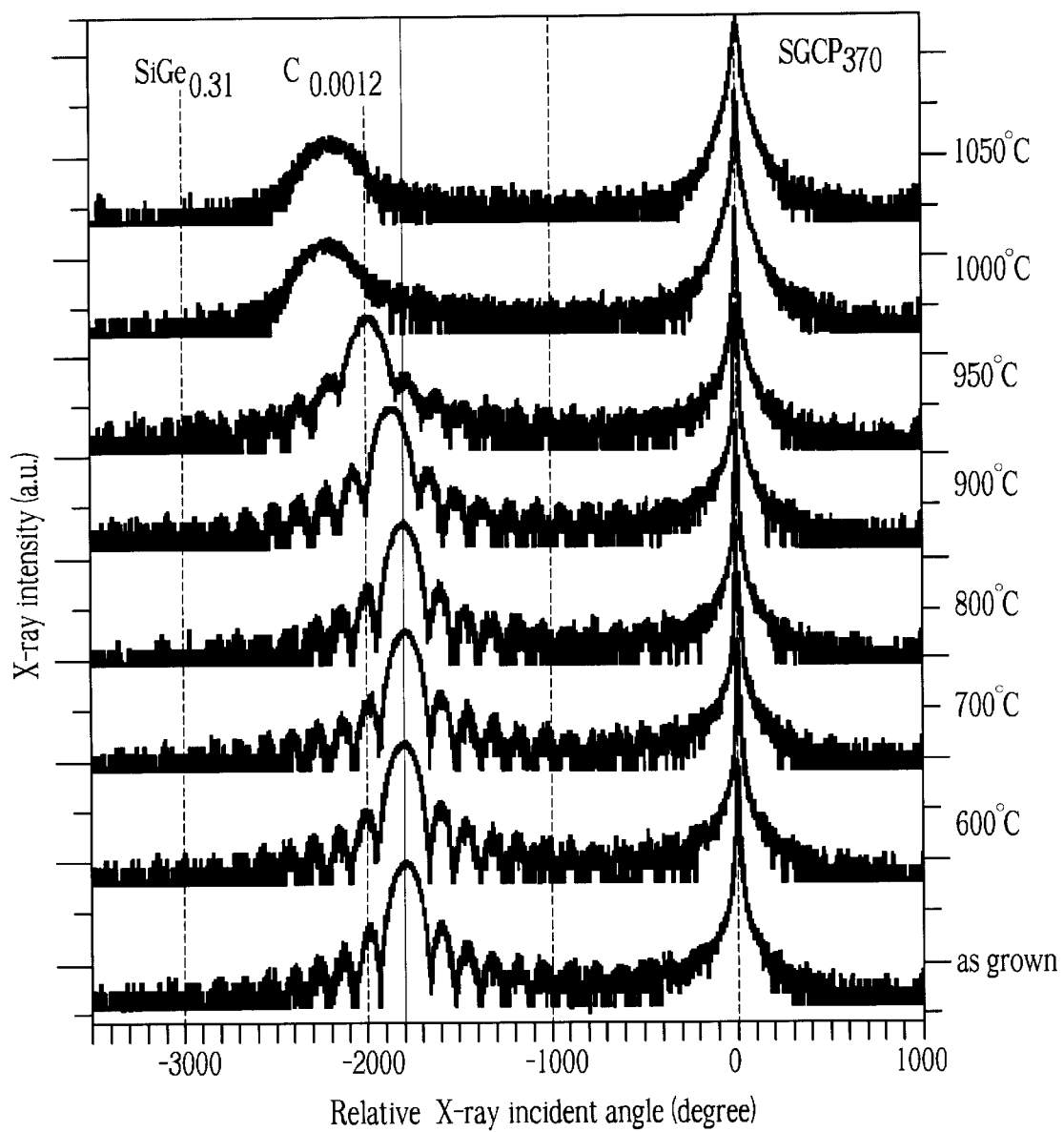
FIG. 8 is a view showing a change in X-ray diffraction spectra of samples of a $SiGe_{0.31}C_{0.0012}$ crystal layer annealed at various temperatures.

FIG. 6 is a cross-sectional view of a heterojunction field effect transistor (HMOSFET) of EMBODIMENT 3, which is a semiconductor device including a short-period superlattice formed by the fabrication method described in EMBODIMENT 1 or 2. In this embodiment, an n-channel HMOSFET is described. It is needless to mention that this embodiment can also be applied to a p-channel HMOSFET.

As shown in FIG. 6, the HMOSFET of this embodiment includes: a Si substrate 111; a p-type well 112 formed on the Si substrate 111 and made of Si with a high concentration of a p-type impurity contained therein; and an i-Si layer 113 formed on the p-type well 112. A δ-doped layer 114 is formed in a region of the i-Si layer 113 located close to but apart a predetermined distance from the surface of the i-Si layer 113 by doping the region with a high concentration of an n-type impurity (e.g., arsenic). A SiGeC layer 116 essentially composed of a $Si_{0.68}Ge_{0.32}/Si_{0.96}C_{0.04}$ short-period superlattice is formed on the i-Si layer 113. A Si cap layer 117 made of intrinsic Si is formed on the SiGeC layer 116, a gate insulating film 118 made of a silicon oxide film is formed on the Si cap layer 117, and a gate electrode 119 made of polysilicon is formed on the gate insulating film 118. A source region 120 and a drain region 121 are formed in regions extending through the i-Si layer 113, the SiGeC layer 116, and the Si cap layer 117 by doping the regions with a high concentration of an n-type impurity (e.g., arsenic) by ion implantation using the gate electrode 119 as a mask.

On the left side of FIG. 6, as is viewed from the figure, is shown an energy level Ec at an end of the conduction band over the layers 113, 114, 116, and 117 underlying the gate electrode of the HMOSFET of this embodiment. It is observed from this illustration that a so-called heterojunction barrier is formed by the band discontinuity existing between the SiGeC layer 116 composed of a $Si_{0.68}Ge_{0.32}/Si_{0.96}C_{0.04}$ short-period superlattice and the i-Si layer 113 at the end of the conduction band. Electrons are confined in a region of the SiGeC layer 116 adjacent to the Si/SiGeC heterojunction barrier, forming an n-channel made of two-dimensional electron gas in this region, thus allowing electrons to run along this n-channel at high speed.

In other words, in the HMOSFET of this embodiment, an n-channel 115 is formed along the Si/SiGeC heterojunction barrier to allow electrons to run along the n-channel 115 at high speed. The mobility of electrons is greater in the SiGeC layer than in the Si layer. Moreover, scattering of an ionized impurity is suppressed since no impurity doping is required for the formation of the n-channel. Thus, high-speed operation can be realized. Furthermore, since the SiGeC layer 116 is composed of a $Si_{0.68}Ge_{0.32}/Si_{0.96}C_{0.04}$ short-period superlattice, alloy scattering can be suppressed in comparison with a bulk SiGeC mixed crystal. This further ensures realization of high-speed operation.

The SiGeC layer 116 may be formed by either the method described in EMBODIMENT 1 in which a $Si_{1-x}Ge_x/Si_{1-y}C_y$ short-period superlattice (0<x,y<1) is formed by epitaxially growing $Si_{1-x}Ge_x$ layers and $Si_{1-y}C_y$ layers alternately, or the method described in EMBODIMENT 2 in which a $Si_{1-x}Ge_x/Si_{1-y}C_y$ short-period superlattice (0<x,y<1) is formed by first epitaxially growing $Si_{1-x}Ge_x$ layers and Si layers alternately to form a $Si/Si_{1-x}Ge_x$ short-period superlattice and then implanting C ions into the superlattice followed by annealing.

It should be noted that Si-containing layers other than the Si layer in this embodiment, such as a SiGe layer and a SiC layer, may also be used as the semiconductor layer for forming heterojunction with the SiGeC layer composed of a $Si_{1-x}Ge_x/Si_{1-y}C_y$ short-period superlattice.

It should also be noted that the function of the $Si_{1-x}Ge_x/Si_{1-y}C_y$ short-period superlattice as a single SiGeC layer will not be lost even if the $Si_{1-x}Ge_x/Si_{1-y}C_y$ short-period superlattice is doped with an n-type or p-type impurity.

In the characteristics shown in FIG. 2, minor generation of discrete quantization levels in the $Si_{1-x}Ge_x/Si_{1-y}C_y$ short-period superlattice should be permitted as long as an energy range capable of functioning as a SiGeC layer as a whole is obtained.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor crystal comprising a superlattice structure including two or more periods of alternately stacked C included first layers containing Si and Ge as major components and second layers containing Si and C as major components, wherein the concentration of C in the first layers is lower than the concentration of C in the second layers, wherein the concentration of C in an interface of the superlattice structure changes continuously, and wherein the superlattice structure functions as a single SiGeC layer.

2. The semiconductor crystal of claim 1, wherein the thickness of each of the C included first layers containing Si and Ge as major components and the second layers containing Si and C as major components is smaller than a thickness which allows discrete quantization levels to be generated.

3. A semiconductor device comprising:

a substrate;

a first semiconductor layer containing at least Si, formed on the substrate; and a second semiconductor layer formed in contact with the first semiconductor layer for functioning as a SiGeC layer, wherein the second semiconductor layer has a structure including at least two or more periods of alternately stacked C included first layers containing Si and Ge as major components and second layers containing Si and C as major components, wherein the concentration of C in the first layers is lower than the concentration of C in the second layers, and wherein the concentration of C in an interface of the superlattice structure changes continuously.

4. The semiconductor device of claim 3, wherein the thickness of each of the C included first layers containing Si and Ge as major components and the second layers containing Si and C as major components is smaller than a thickness which allows discrete quantization levels to be generated.

* * * * *